United States Patent
Ahn et al.

(10) Patent No.: US 9,324,754 B2
(45) Date of Patent: Apr. 26, 2016

(54) IMAGING SENSORS INCLUDING PHOTODETECTING DEVICES WITH DIFFERENT WELL CAPACITIES AND IMAGING DEVICES INCLUDING THE SAME

(71) Applicant: Samsung Electronics Co., Ltd., Suwon-si (KR)

(72) Inventors: Jung-chak Ahn, Yongin-si (KR); Dong-young Jang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 14/160,028

(22) Filed: Jan. 21, 2014

(65) Prior Publication Data

US 2014/0354863 A1    Dec. 4, 2014

(30) Foreign Application Priority Data

May 31, 2013    (KR) .................. 10-2013-0063111

(51) Int. Cl.
*H04N 5/335*    (2011.01)
*H01L 27/146*    (2006.01)

(52) U.S. Cl.
CPC ...... *H01L 27/14625* (2013.01); *H01L 27/1462* (2013.01); *H01L 27/14607* (2013.01)

(58) Field of Classification Search
CPC ............. H01L 27/14605; H04N 3/233; H04N 5/3572; H04N 5/3696
See application file for complete search history.

(56) References Cited

U.S. PATENT DOCUMENTS

| | | | |
|---|---|---|---|
| 8,022,450 B2 | 9/2011 | Lim | |
| 8,629,486 B2 | 1/2014 | Ahn et al. | |
| 2006/0054786 A1* | 3/2006 | Galambos et al. | 250/208.1 |
| 2010/0140453 A1 | 6/2010 | Kikuchi | |
| 2012/0241592 A1* | 9/2012 | Huang et al. | 250/208.1 |
| 2013/0171946 A1 | 7/2013 | Veihl et al. | |

FOREIGN PATENT DOCUMENTS

| | | |
|---|---|---|
| JP | 11-150254 | 6/1999 |
| KR | 1020060077212 A | 7/2006 |
| KR | 1020090022357 A | 3/2009 |
| KR | 1020090055773 A | 6/2009 |
| KR | 1020090098002 A | 9/2009 |
| KR | 1020110037187 A | 4/2011 |
| KR | 1020110079276 A | 7/2011 |

* cited by examiner

*Primary Examiner* — Sinh Tran
*Assistant Examiner* — Selam Gebriel
(74) *Attorney, Agent, or Firm* — Myers Bigel & Sibley, P.A.

(57) ABSTRACT

An image sensor includes a first photo detecting device disposed in a central region of a pixel array portion and a second photo detecting device disposed in an edge of the pixel array portion. The second photo detecting device has a full well capacity which is less than a full well capacity of the first photo detecting device. An imaging device includes the image sensor and an image signal process. The image signal processor compensates for a lens shading effect and a difference between the full well capacity of the first photo detecting device and the full well capacity of the second photo detecting device.

12 Claims, 10 Drawing Sheets

IMAGING SENSORS INCLUDING PHOTODETECTING DEVICES WITH DIFFERENT WELL CAPACITIES AND IMAGING DEVICES INCLUDING THE SAME

CROSS-REFERENCE TO RELATED APPLICATIONS

This application claims the benefit of Korean Patent Application No. 10-2013-0063111, filed on May 31, 2013, in the Korean Intellectual Property Office, the disclosure of which is incorporated herein in its entirety by reference.

BACKGROUND

The present disclosure relates to image sensors and imaging devices including the same, and more particularly, to image sensors having photo detecting devices whose characteristics vary according to a lens shading effect and imaging devices including the same.

Image sensors for converting optical images into electrical signals have been widely used in not only digital cameras, mobile phone cameras and portable camcorders but also automobiles, security systems and robots. Each of the image sensors may include a pixel array portion, and the pixels may receive light through a module lens. The module lens may refract the light to focus the light on the pixel array portion in order to capture an image, and the pixel array portion may include a plurality of pixels. Each of the pixels included in the pixel array portion may include a photo detecting device, and the photo detecting device may receive the light to generate an electrical signal whose current or voltage varies according to an intensity of the light. For example, the photo detecting device may be a photodiode that receives the light to generate a current.

The module lens may be fabricated to have a curved surface in order to focus the light on the pixel array portion. Due to the curved surface of the module lens, a light intensity on an edge of the pixel array portion may be relatively weaker than a light intensity on a central region of the pixel array portion. This phenomenon is referred to as 'a lens shading effect'. The image sensor may output a source data based on the electrical signals that the photo detecting devices generate in response to the light, and the source data may be transmitted to an image signal processor. The image signal processor may receive the source data and may compensate for the lens shading effect to generate an image data without defects.

SUMMARY

In various embodiments of the inventive concept, image sensors and imaging devices including the same are provided.

According to some embodiments, an image sensor includes a first photo detecting device disposed in a central region of a pixel array portion and a second photo detecting device disposed in an edge of the pixel array portion. The second photo detecting device has a full well capacity which is less than a full well capacity of the first photo detecting device.

In some embodiments, the image sensor may further include a third photo detecting device disposed in the pixel array portion between the first and second photo detecting devices. The third photo detecting device may have a full well capacity which is less than that of the first photo detecting device and greater than that of the second photo detecting device.

In some embodiments, the full well capacities of the first, second and third photo detecting devices may be proportional to the intensities of light irradiated on the first, second and third photo detecting devices through a module lens refracting the light.

In some embodiments, the full well capacities of the first, second and third photo detecting devices may be determined according to a light intensity profile of the module lens.

In some embodiments, the full well capacities of the first, second and third photo detecting devices may be determined according to chief ray angles(CRAs) with respect to the first, second and third photo detecting devices.

In some embodiments, the image sensor may further include a plurality of filters irradiating specific lights having desired wavelengths onto respective ones of the first, second and third photo detecting devices and a plurality of air gap regions disposed between the plurality of filters. A refractive index of each of the filters may be greater than a refractive index of each of the air gap regions.

In some embodiments, a planar surface area of the second photo detecting device on which light is irradiated may be less than that of the first photo detecting device on which the light is irradiated.

In some embodiments, each of the first and second photo detecting devices may include a photodiode. A size of an N-type photodiode (NPD) of the second photo detecting device may be less than a size of an NPD of the first photo detecting device.

According to further embodiments, an imaging device includes a module lens refracting light to irradiate the refracted light on a pixel array portion, an image sensor including a first photo detecting device disposed in a central region of the pixel array portion and a second photo detecting device disposed in an edge of the pixel array portion, and an image signal processor receiving source data that are output from the image sensor to generate image data. A full well capacity of the second photo detecting device may be less than that of the first photo detecting device, and the image signal processor may compensate for a difference between the full well capacity of the first photo detecting device and the full well capacity of the second photo detecting device.

In some embodiments, the imaging device may further include a third photo detecting device disposed in the pixel array portion between the first and second photo detecting devices. The third photo detecting device may have a full well capacity which is less than the full well capacity of the first photo detecting device and greater than the full well capacity of the second photo detecting device, and the image signal processor may compensate for a difference between the full well capacity of the first photo detecting device and the full well capacity of the third photo detecting device.

In some embodiments, the image signal processor may further compensate for a difference between the intensities of light irradiated on the first, second and third photo detecting devices through the module lens.

In some embodiments, the image sensor may further include a plurality of filters and a plurality of air gap regions disposed between the plurality of filters. The plurality of filters may irradiate specific lights having desired wavelengths onto respective ones of the first, second and third photo detecting devices. A refractive index of each of the filters may be greater than a refractive index of each of the air gap regions.

In some embodiments, each of the first and second photo detecting devices may include a photodiode. A size of an N-type photodiode (NPD) of the second photo detecting device may be less than a size of an NPD of the first photo detecting device. The image signal processor may compensate for a difference between the sizes of the NPDs of the first and second photo detecting devices.

In some embodiments, the image signal processor may include a gain storing unit and an operation unit. The gain storing unit may stores a constant for compensating for a difference between the full well capacity of the first photo detecting device and the full well capacity of the second photo detecting device. The operation unit may execute a mathematical operation of the source data and the constant to generate the image data.

In some embodiments, the constant further compensates for a difference between the intensity of light irradiated on the first photo detecting device and the intensity of light irradiated on the second photo detecting device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Embodiments of the present inventive concepts now will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
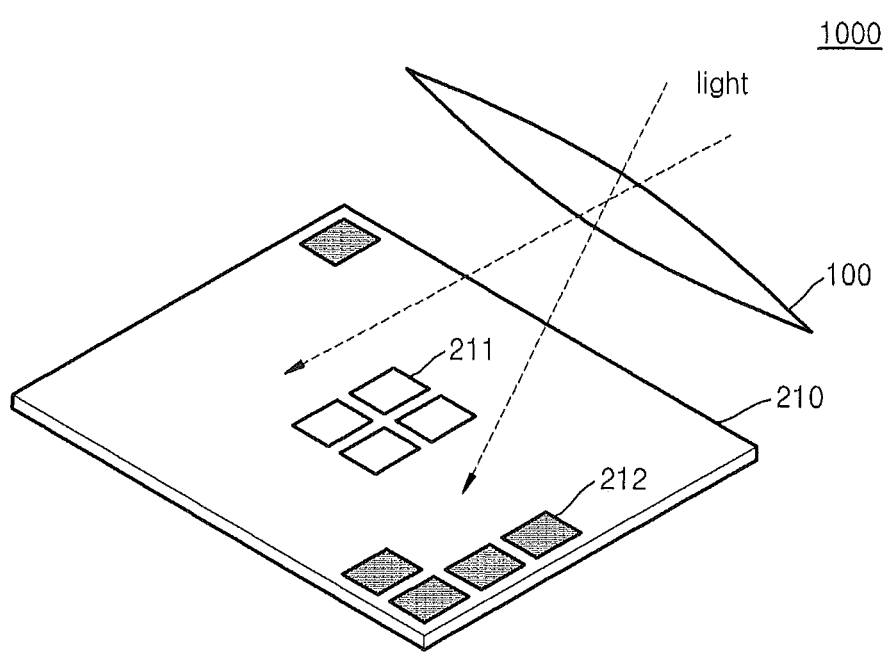
FIG. 1 is a schematic view illustrating an imaging device according to some embodiments of the inventive concept.

FIG. 1 is a schematic view illustrating an imaging device 1000 according to some embodiments of the inventive concept. As illustrated in FIG. 1, the imaging device 1000 may convert light into electrical signals to output image data and may include a module lens 100 and a pixel array portion 210. The module lens 100 may refract the light reflecting from external objects to focus the light on the pixel array portion 210 in order to capture an image. The pixel array portion 210 may include a plurality of pixels, each of which may include a photo detecting device 211 or 212. For example, as illustrated in FIG. 1, the pixel array portion 210 may be configured to have a rectangular shape and the photo detecting devices 211 and 212 in the plurality of pixels may be arrayed in two dimensions along rows and columns. The photo detecting device 211 or 212 of each pixel may sense the light and may generate an electrical signal whose level varies according to an intensity of light incident thereon. The photo detecting device 211 or 212 may include a photodiode, a photogate or a phototransistor.

The intensity of the light reaching the pixel array portion 210 through a central region of the module lens 100 may be greater than the intensity of the light reaching the pixel array portion 210 through an edge of the module lens 100. To this end, the image that is output from the imaging device 1000 may be gradually darkened toward the edge of the image. This phenomenon is referred to as 'a lens shading effect'. For example, a shape of a curved surface of the module lens 100 and an internal diaphragm of the module lens 100 may influence and cause the lens shading effect.

The photo detecting device 211 or 212 may have a maximum capacity that can store electric charges generated in response to the light. The maximum charge capacity of the photo detecting device is referred to as 'a full well capacity'. A dynamic range may correspond to an image brightness range that the imaging device 1000 can obtain without any loss. If the dynamic range increases, the imaging device 1000 may sense more diverse brightness of images. This dynamic range of the imaging device 1000 may be determined according to the full well capacity of the photo detecting device 211 or 212. That is, if the full well capacity of the photo detecting device 211 or 212 increases, the amount of charges that the photo detecting device 211 or 212 can generate and store in response to the light may also increase which may widen the dynamic range of the imaging device 1000.

Various methods may be used to increase the full well capacity of the photo detecting device 211 or 212. For example, in the event that a photodiode is employed as the photo detecting device 211 (or 212), the full well capacity of the photodiode may be increased by increasing an impurity concentration of a photodiode, such as an N-type photodiode (NPD) (i.e., an N-type region of the photodiode). However, if the impurity concentration of the NPD increases, an electric field between the NPD and a P-type region adjacent to the NPD may increase to cause some undesired phenomena. For example, an increase of the impurity concentration of the NPD may cause an increase of a leakage current of the photodiode, and the increase of the leakage current of the photodiode may generate a white spot in the image data. The white spot may correspond to a bright spot in a dark image, and the bright spot may appear due to an abnormal pixel (i.e., a photo detecting device) that outputs an electrical signal having a relatively high level as compared with an output signal of a normal pixel. As a result, if the impurity concentration of the NPD is increased to increase the full well capacity of the photo detecting device 211 or 212, a white spot may appear in the image data. Accordingly, there may be a limitation in increasing the impurity concentration of the NPD. It will be appreciated that some embodiments of the inventive concepts are not limited to n-type photodiodes.

In some embodiments, the pixel array portion 210 may include the first photo detecting devices 211 disposed in a central region thereof and the second photo detecting devices 212 disposed along edges thereof. The full well capacity of each of the second photo detecting devices 212 may be less than the full well capacity of each of the first photo detecting devices 211. Even though the imaging device 1000 receives the light having a uniform intensity or brightness throughout the module lens 100, the intensity of the light irradiated on each of the second photo detecting devices 212 may be less that the intensity of the light irradiated on each of the first photo detecting devices 211 because of the lens shading effect. Thus, the full well capacity of the second photo detecting devices 212 may be reduced to be less than the full well capacity of the first photo detecting devices 211 without having influence on the dynamic range of the imaging device 1000. Decreasing the full well capacity of the second photo detecting devices 212 may reduce or suppress the generation of the white spots in edges of the image.

Figure 2:
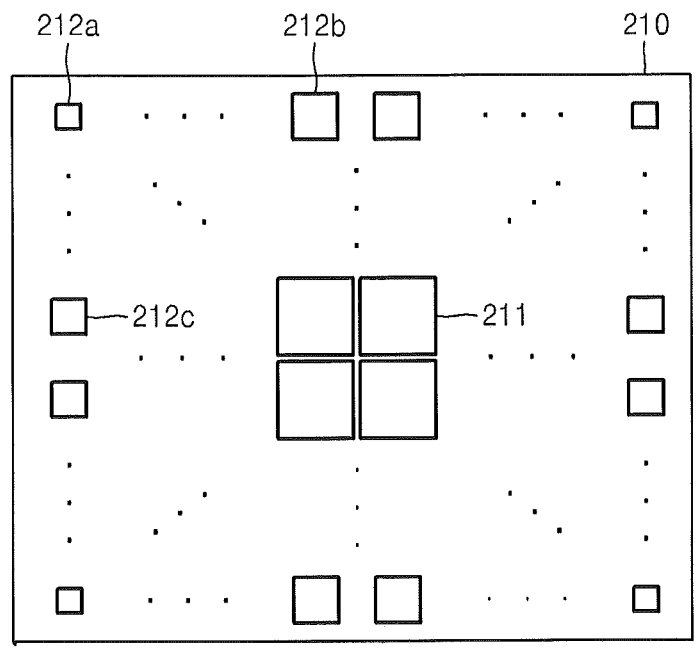
FIG. 2 is a plan view illustrating a pixel array portion of an imaging device according to further embodiments of the inventive concept.

FIG. 2 is a plan view illustrating a pixel array portion 210 of an imaging device according to some embodiments of the inventive concept. The pixel array portion 210 may include a plurality of pixels and each of the plurality of pixels may include a photo detecting device. For example, as illustrated in FIG. 2, the pixel array portion 210 may be configured to have a rectangular shape and the photo detecting devices in the plurality of pixels may be arrayed in two dimensions along rows and columns. Further, as described with reference to FIG. 1, the pixel array portion 210 may include first photo detecting devices 211 disposed in a central region thereof and second photo detecting devices 212a, 212b and 212c disposed along edges thereof. The full well capacity of each of the second photo detecting devices 212a, 212b and 212c may be less than the full well capacity of each of the first photo detecting devices 211.

In some embodiments, a planar surface area of each of the second photo detecting devices 212a, 212b and 212c may be less than a planar surface area of each of the first photo detecting devices 211, as illustrated in FIG. 2. The intensity of the light irradiated onto each of the first and second photo detecting devices 211, 212a, 212b and 212c may be proportional to the planar surface area thereof. The planar surface areas of the first and second photo detecting devices 211, 212a, 212b and 212c may be controlled by changing sizes of open regions of a photo mask used in an implantation process for forming the first and second photo detecting devices 211, 212a, 212b and 212c.

The second photo detecting devices 212a, 212b and 212c may be designed to have planar surface areas different from each other. For example, in the event that the pixel array portion 210 is designed to have a rectangular shape as illustrated in FIG. 2, each of the second photo detecting devices 212a located at corners of the pixel array portion 210 to be farthest from a central point of the pixel array portion 210 may be designed to have a planar surface area which is less than any other planar areas of the second photo detecting devices 212b and 212c. Furthermore, in the event that the pixel array portion 210 is designed to have a rectangular shape having a horizontal length and a vertical length less than the horizontal length, a planar surface area of each of the second photo detecting devices 212c adjacent to a vertical side may be different from that of each of the second photo detecting devices 212b adjacent to a horizontal side. Descriptions of the planar surface areas of the second photo detecting devices 212a, 212b and 212c will be described in more detail later.

Figure 3:
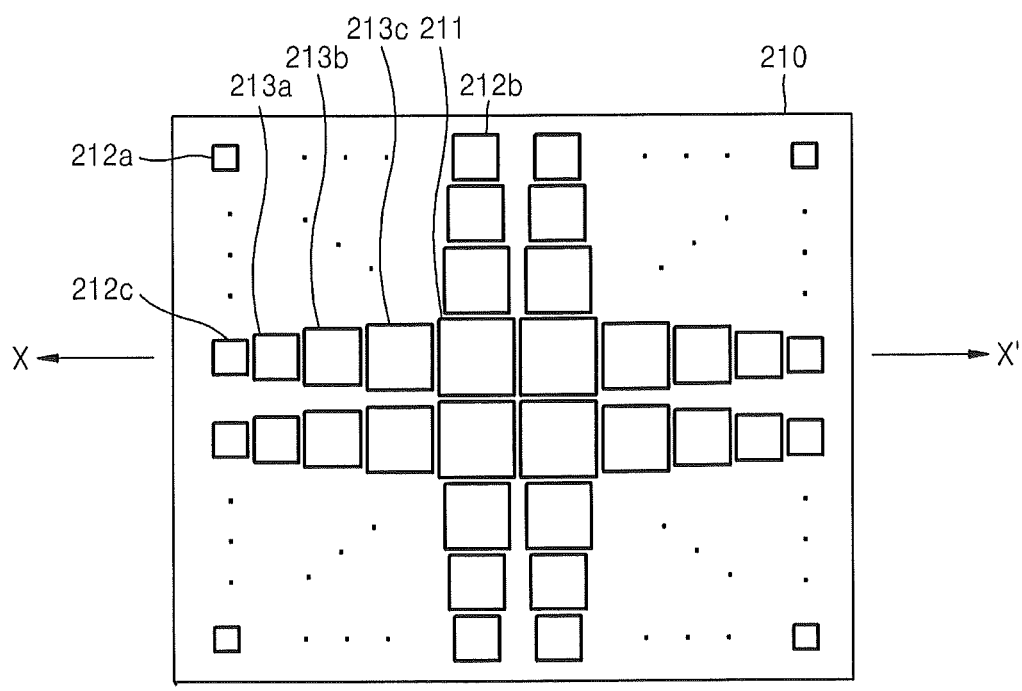
FIG. 3 is a plan view illustrating a pixel array portion of an imaging device according to further embodiments of the inventive concept.

FIG. 3 is a plan view illustrating a pixel array portion 210 of an imaging device according to still another exemplary embodiment of the inventive concept. As described above, the pixel array portion 210 may be configured to have a rectangular shape and the photo detecting devices of the pixel array portion 210 may be arrayed in two dimensions along rows and columns. For example, the number of the photo detecting devices arrayed in each row may be ten and the number of the photo detecting devices arrayed in each column may be eight, as illustrated in FIG. 3.

According to some embodiments, the pixel array portion 210 may include first photo detecting devices 211 disposed in a central region thereof, second photo detecting devices 212a, 212b and 212c disposed along edges thereof, and third photo detecting devices 213a, 213b and 213c disposed between the central region and the edges thereof. As described in the previous embodiment shown in FIG. 2, the full well capacity of each of the second photo detecting devices 212a, 212b and 212c may be less than that of each of the first photo detecting devices 211. Furthermore, in the present embodiment of FIG. 3, the full well capacity of each of the third photo detecting devices 213a, 213b and 213c may be less than that of each of the first photo detecting devices 211 and may be greater than that of each of the second photo detecting devices 212a, 212b and 212c. The image generated by the pixel array portion 210 may be continuously and gradually darkened as it becomes closer to the edges thereof because of the lens shading effect. In addition, as described above, the full well capacity of each of the third photo detecting devices 213a, 213b and 213c may be less than that of each of the first photo detecting devices 211 and may be greater than that of each of the second photo detecting devices 212a, 212b and 212c. Like the effect which is obtained due to reduction of the full well capacity of the second photo detecting devices 212a, 212b and 212c, generation of the white spots in the image corresponding to the third photo detecting devices 213a, 213b and 213c may also be reduced or suppressed because of reduction of the full well capacity of the third photo detecting devices 213a, 213b and 213c.

In some embodiments, a planar surface area of any one of the second photo detecting devices 212a, 212b and 212c may be less than a planar surface area of any one of the third photo detecting devices 213a, 213b and 213c, and a planar surface area of any one of the first photo detecting devices 211 may be greater than a planar surface area of any one of the third photo detecting devices 213a, 213b and 213c. For example, as illustrated in FIG. 3, a planar surface area of the second photo detecting device 212c adjacent to a left vertical side of the pixel array portion 210 may be less than a planar surface area of one of the first photo detecting devices 211. Furthermore, a planar surface area of one of the third photo detecting devices 213a, 213b and 213c located between the first photo detecting devices 211 and the second photo detecting devices 212c may be equal to or less than that of one of the first photo detecting devices 211 and may be equal to or greater than that of the second photo detecting device 212c.

The planar surface areas of the third photo detecting devices 213a, 213b and 213c may be different from each other. For example, as illustrated in FIG. 3, the planar surface areas of the third photo detecting devices 213a, 213b and 213c located between the first photo detecting devices 211 and the second photo detecting devices 212c may be gradually reduced toward the edge of the pixel array portion 210. That is, as illustrated in FIG. 3, the planar surface areas of the photo detecting devices arrayed in one row may be reduced toward the edge of the pixel array portion 210. Similarly, as illustrated in FIG. 3, the planar surface areas of the photo detecting devices arrayed in one column may be reduced toward the edge of the pixel array portion 210.

Figure 4:
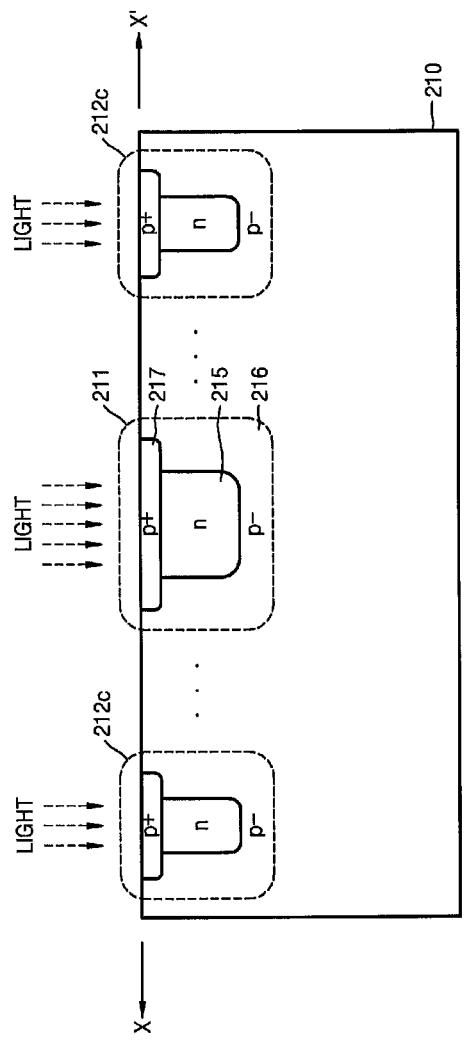
FIG. 4 is a cross-sectional view taken along a line X-X' of FIG. 3.

FIG. 4 is a cross-sectional view of the pixel array portion 210 illustrated in FIG. 3. For example, FIG. 4 is a cross-sectional view taken along a line X-X' of FIG. 3. According to the cross-sectional view of FIG. 4, each of the photo detecting devices 211 and 212c may be a photodiode. The photodiode may include an NPD 215 and a P-type epitaxial layer 216 contacting the NPD 215.

In some embodiments, the photodiode may be a pinned photodiode and the pinned photodiode may include a thin P-type layer 217 disposed between the NPD 215 and a top surface of the pixel array portion 210. The light may be irradiated onto the top surface of the pixel array portion 210. The P-type layer 217 may separate the NPD 215 from the top surface of the pixel array portion 210. If the light is irradiated onto the photodiode, the photodiode may generate electric charges and the electric charges may be stored in the NPD 215. Thus, if the NPD 215 is heavily doped to increase the impurity concentration thereof, the amount of the electric charges that can be stored in the NPD 215 may increase. That is, if the impurity concentration of the NPD 215 increases, the full well capacity of the NPD 215 may be increased. However, in such a case, an electric field between the NPD 215 and the P-type region contacting the NPD 215 may increase to cause some problems, as described above.

In some embodiments, a size (e.g., a width) of the NPD 215 of the second photo detecting device 212c may be less than that of the NPD 215 of the first photo detecting device 211. Thus, the full well capacity of the second photo detecting device 212c may be less than that of the first photo detecting device 211. The size (i.e., the width) of the NPD 215 of the second photo detecting device 212c may be reduced to be less than that of the NPD 215 of the first photo detecting device 211 by appropriately designing a photo mask used in an implantation process for forming the NPDs 215 of the first and second photo detecting devices 211 and 212c such that a size of open regions corresponding to the NPDs 215 of the second photo detecting devices 212c is less than a size of open regions corresponding to the NPDs 215 of the first photo detecting devices 211.

Although FIG. 4 illustrates only the first and second photo detecting devices 211 and 212c, the third photo detecting devices 213a, 213b and 213c shown in FIG. 3 may also be disposed between the first and second photo detecting devices 211 and 212c. In such a case, a size (e.g., a width) of the NPD of any one of the third photo detecting devices 213a, 213b and 213c may be less than that of the NPD of any one of the first photo detecting devices 211 and may be greater than that of the NPD of any one of the second photo detecting devices 212c. Furthermore, although FIG. 4 illustrates only the photo detecting devices 211 and 212c, each of the pixels constituting the pixel array portion 210 may further include some transistors, such as a transfer transistor for transferring charges generated in the photo detecting device 211 or 212c, a reset transistor for initializing the pixel, a selection transistor for selecting the pixel, and the like.

Figure 5:
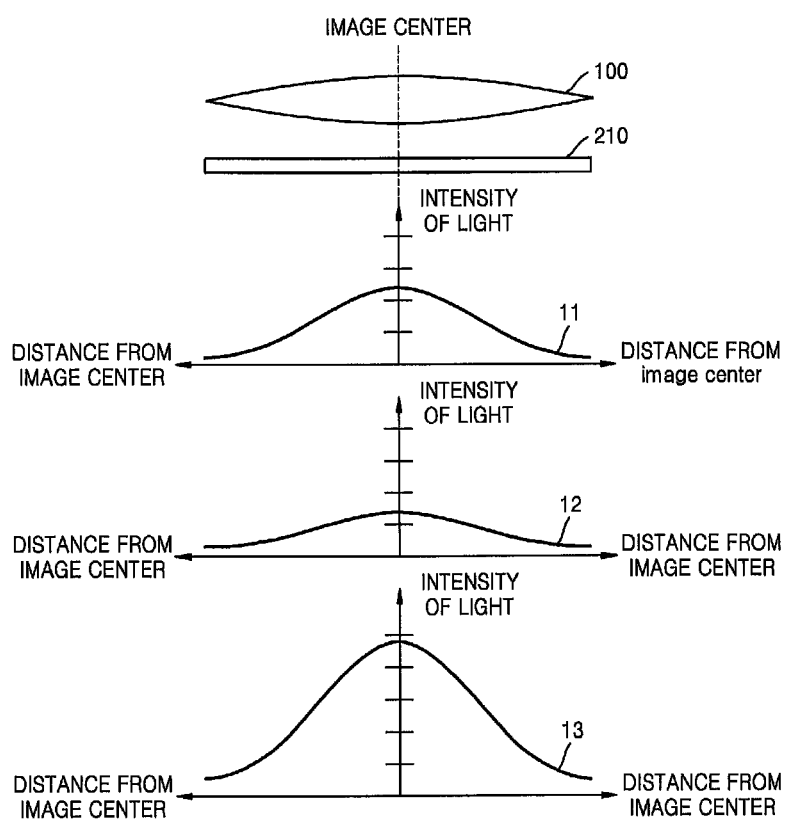
FIG. 5 illustrates various graphs showing the intensity of light irradiated on a pixel array portion as a function of a distance from a central point of the pixel array portion.

FIG. 5 illustrates various graphs showing the intensity of light irradiated onto a pixel array portion 210 as a function of a distance from a central point of the pixel array portion 210. As illustrated in FIG. 5, the module lens 100 may be aligned with the pixel array portion 210 such that a central point of the module lens 100 and a central point of the pixel array portion 210 are located on a single vertical line, and the central point of the module lens 100 may correspond to a central point of an image. Although FIG. 5 illustrates an example in which a width (or a diameter) of the module lens 100 is substantially equal to a width of the pixel array portion 210, the width (or a diameter) of the module lens 100 may be different from the width of the pixel array portion 210. Curves 11, 12 and 13 indicate the intensity of light irradiated on the pixel array portion 210 as a function of a distance from a central point of the pixel array portion 210. The curve 11 indicates the intensity of the light irradiated onto the pixel array portion 210 according to a lens shading effect. The curve 12 indicates the intensity of the light irradiated onto the pixel array portion 210 including the photo detecting devices having different full well capacities according to an embodiment. The curve 13 corresponds to a total light intensity of the curve 11 and the curve 12.

As indicated by the curve 11, the light intensity influenced by only the lens shading effect may be gradually reduced from the image center toward edges of the pixel array portion 210. A shape of the curve 11 may depend on the module lens 100, and the curve 11 may be referred to as a light intensity profile of the module lens 100. The curve 11 may be obtained by taking a picture of an object reflecting uniform light without any contrast between brightness and darkness. An image sensor including the pixel array portion 210 may output source data created by electric charges which are stored in the photo detecting devices of the pixel array portion 210, and the source data may be processed by an image signal processor. In particular, the image signal processor may compensate for the lens shading effect based on the curve 11. For example, the image signal processor may calculate and store constants for inverting the curve 11, and may execute a multiplication operation of the constants and the source data created by the electric charges which are stored in the photo detecting devices.

In some embodiments, the full well capacities of the photo detecting devices in the pixel array portion 210 may be determined according to the light intensity profile of the module lens 100. That is, based on the light intensity profile of the module lens 100, the NPD of each of the photo detecting devices located in the central region of the pixel array portion 210 may be designed to have a relatively large planar surface area and the NPD of each of the photo detecting devices located in the edge of the pixel array portion 210 may be designed to have a relatively small planar surface area.

As indicated by the curve 12, according to some embodiments, the intensity of the light absorbed in each of the photo detecting devices having different full well capacities may be gradually reduced from the image center toward edges of the pixel array portion 210. In some embodiments, a full well capacity of any one of second photo detecting devices disposed in edges of the pixel array portion 210 may be less than full well capacity of any one of first photo detecting devices disposed in a central region of the pixel array portion 210. Thus, even though the light is uniformly irradiated onto the first and second photo detecting devices without the module lens 100, the amount of charges stored in each of the second photo detecting devices 212 may be less than the amount of charges stored in each of the first photo detecting devices 211. The curve 12 indicates the intensity of light, when the light is uniformly irradiated onto the pixel array portion 210 without the module lens 100, which the first photo detecting device can absorb if the first photo detecting device accumulates the same amount of charges stored in each of photo detecting devices of the pixel array portion 210 according to the distance from the center of image. That is, the curve 12 indicates the intensity of light allowing the first photo detecting device to accumulate the same amount of charges which each of photo detecting devices of the pixel array portion 210 accumulated when the light is uniformly irradiated onto the pixel array portion 210 without the module lens 100.

The curve 13 is a combination of the curve 11 and the curve 12. That is, the curve 13 may be a curve that is obtained by applying the lens shading effect to the pixel array portion 210 including the photo detecting devices designed to have different full well capacities. As indicated by the curve 13, a difference between the intensity of light irradiated onto the central region of the pixel array portion 210 and the intensity of light irradiated onto the edges of the pixel array portion 210 may be more increased as compared with the curves 11 and 12.

Figure 6:
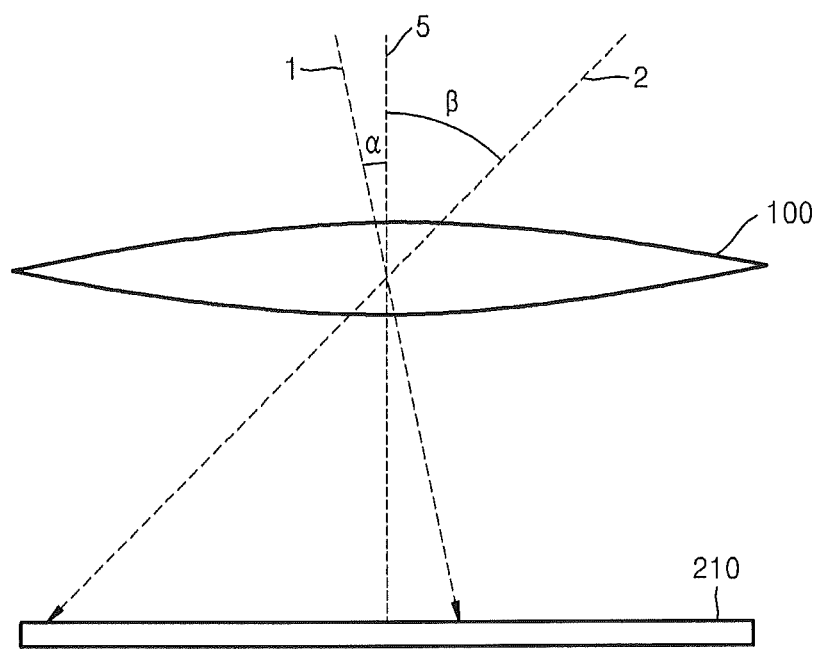
FIG. 6 illustrates paths of light irradiated onto a pixel array portion through a module lens.

FIG. 6 illustrates paths of light irradiated onto a pixel array portion 210 through a module lens 110. As illustrated in FIG. 6, the module lens 100 may be aligned with the pixel array portion 210 such that a central point of the module lens 100 and a central point of the pixel array portion 210 are located on a single vertical line 5. According to an embodiment, a planar surface area of an NPD of one of photo detecting devices included in the pixel array portion 210 may be determined according to a chief ray angle (CRA) corresponding to an incident angle of a chief ray which is irradiated onto the pixel array portion 210 through the module lens 100. For example, as illustrated in FIG. 6, an incident angle α of a chief ray 1 may be less than an incident angle β of a chief ray 2 and the chief ray 1 may reach around the central point of the pixel array portion 210 through the module lens 100. An incident angle β of the chief ray 2 may be greater than an incident angle α of the chief ray 1 and the chief ray 2 may reach around an edge of the pixel array portion 210 through the module lens 100. Thus, a planar surface area of an NPD of one of the photo detecting devices included in the pixel array portion 210 may be determined to be inversely proportional to a CRA of a chief ray that reaches the corresponding NPD. For example, a planar surface area of an NPD of any one of the photo detecting devices included in the pixel array portion 210 may be determined to be proportional to a cosine value of the CRA of a chief ray that reaches the corresponding NPD.

Figure 7:
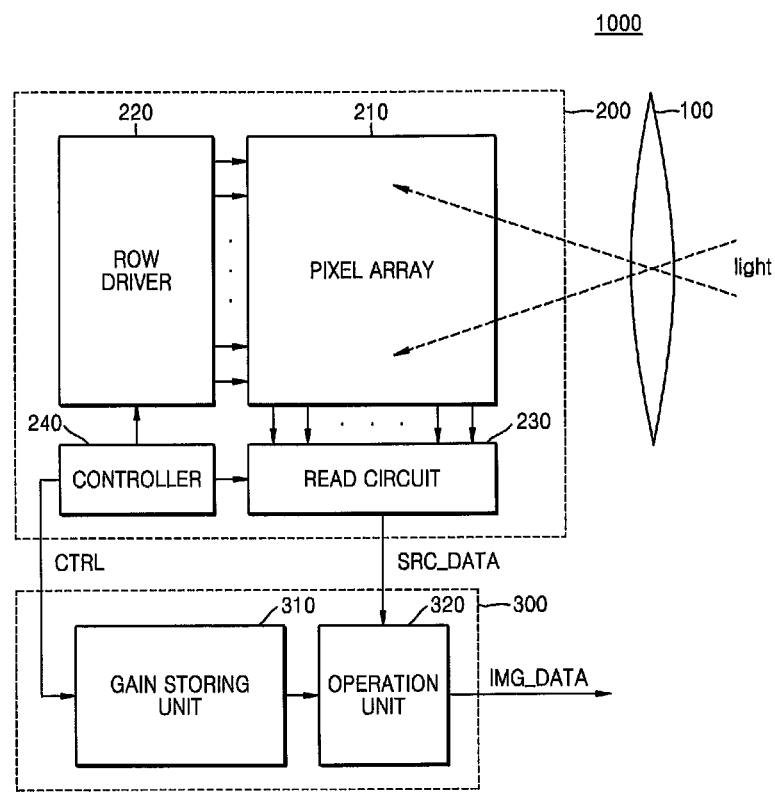
FIG. 7 is a block diagram illustrating an imaging device according to some embodiments.

FIG. 7 is a block diagram illustrating an imaging device 1000 according to an exemplary embodiment. Referring to FIG. 7, the imaging device 1000 may include a module lens 100, an image sensor 200 and an image signal processor 300. The module lens 100 may refract light and may irradiate the refracted light onto the image sensor 200. The image sensor 200 may generate and output source data SRC_DATA in response to the refracted light. The image signal processor 300 may receive the source data SRC_DATA to generate and output image data IMG_DATA.

As illustrated in FIG. 7, the image sensor 200 may include a pixel array portion 210, a row driver 220, a read circuit 230 and a controller 240. The pixel array portion 210 may include a plurality of pixels, and each of the pixels may include the photo detecting device described in the previous embodiments. The pixel array portion 210 may convert the light irradiated onto the photo detecting devices into electrical signals and may transmit the electrical signals to the read circuit 230. The row driver 220 may output signals for controlling the pixels included in the pixel array portion 210. For example, the row driver 220 may output control signals for resetting (or initializing) the pixels or outputting the electrical signals generated by charges stored in the photo detecting devices of the pixels.

As illustrated in FIG. 7, the read circuit 230 may receive the electrical signals output from the pixel array portion 210 to output the source data SRC_DATA. For example, the read circuit 230 may include an analogue-to-digital converter (ADC) converting the electrical signals (i.e., analogue signals) output from the pixel array portion 210 into digital signals and may output the digital signals as the source data SRC_DATA. The controller 240 may control the row driver 220 and the read circuit 230 and may also output a control signal CTRL transmitted to the image signal processor 300. The control signal CTRL may include information on the source data SRC_DATA output from the read circuit 230. For example, in the event that the read circuit 230 simultaneously outputs all the electrical signals output from the pixels arrayed in any one selected from a plurality of rows of the pixel array portion 210, the control signal CTRL may include the information on the selected row.

As illustrated in FIG. 7, the image signal processor 300 may include a gain storing unit 310 and an operation unit 320. The gain storing unit 310 may store at least one group of constants for compensating the source data SRC_DATA based on the curve 11, the curve 12 or the curve 13 described with reference to FIG. 5. For example, the gain storing unit 310 may store constants for compensating for the lens shading effect of the module lens based on the curve 11, constants for compensating for the full well capacities of the photo detecting devices designed according to the embodiments based on the curve 12, or constants for compensating for both the lens shading effect of the module lens and the full well capacities of the photo detecting devices designed according to the embodiments based on the curve 13. Furthermore, the gain storing unit 310 may receive the control signal CTRL output from the controller 240 to output constants corresponding to the source data SRC_DATA according to the information included in the control signal CTRL.

As illustrated in FIG. 7, the operation unit 320 may receive the source data SRC_DATA output from the read circuit 230 and the constants output from the gain storing unit 310. The operation unit 320 may execute a predetermined operation to output the image data IMG_DATA. For example, the operation unit 320 may execute a multiplication operation of the source data SRC_DATA generated from the read circuit 230 and the constants generated from the gain storing unit 310 to output the image data IMG_DATA.

Figure 8:
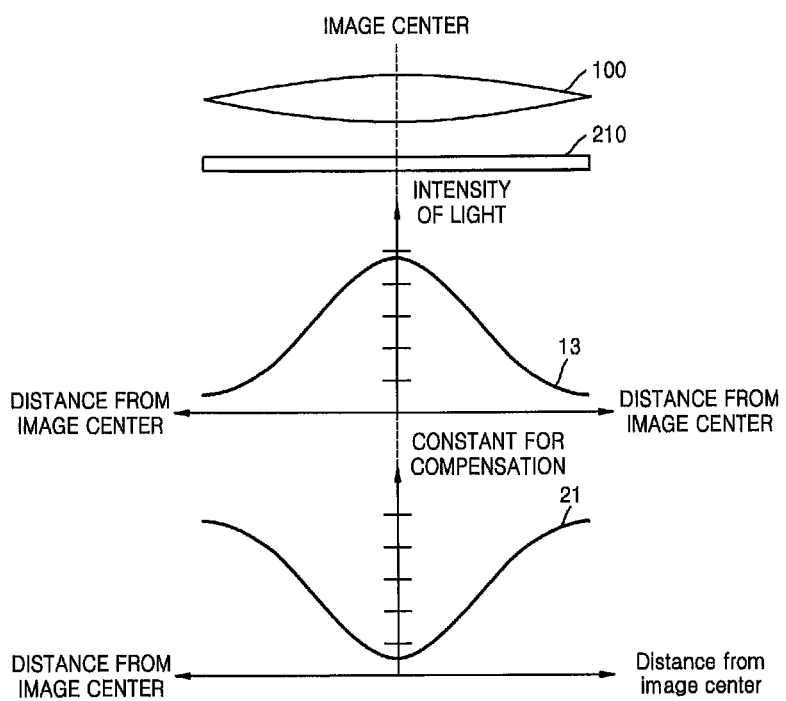
FIG. 8 illustrates graphs showing the intensity of light irradiated on a pixel array portion as a function of a distance from a central point of the pixel array portion and showing constants for compensating the intensity of light.

FIG. 8 illustrates graphs showing the intensity of light irradiated onto a pixel array portion 210 as a function of a distance from a central point of the pixel array portion 210 and showing constants for compensating the intensity of light. As described with reference to FIG. 5, the curve 13 may reflect both the lens shading effect of the module lens 100 and the different full well capacities of the photo detecting devices of the pixel array portion 210 according to the present embodiment. As illustrated in FIG. 8, the intensity of the light irradiated onto the pixel array portion 210 may be gradually reduced from the central point of the pixel array portion 210 toward the edges of the pixel array portion 210 because of the lens shading effect of the module lens 100 and the different full well capacities of the photo detecting devices of the pixel array portion 210.

The curve 21 indicates constants for compensating for the influences of the lens shading effect of the module lens 100 and the different full well capacities of the photo detecting devices based on the curve 13, and the gain storing unit 310 of FIG. 7 may store the constants indicated by the curve 21. As illustrated in FIG. 8, the curve 21 may be obtained by inverting the curve 13. For example, when the intensity of the light irradiated onto the second photo detecting device disposed in an edge of the pixel array portion 210 is one fifth (20%) the intensity of the light irradiated onto the first photo detecting device disposed in a central region of the pixel array portion 210, the constant corresponding to the second photo detecting device may be five times greater than the constant corresponding to the first photo detecting device. As a result, any undesired factors or defects that the curve 13 may have may be removed by compensation which is based on the curve 21.

Figure 9:
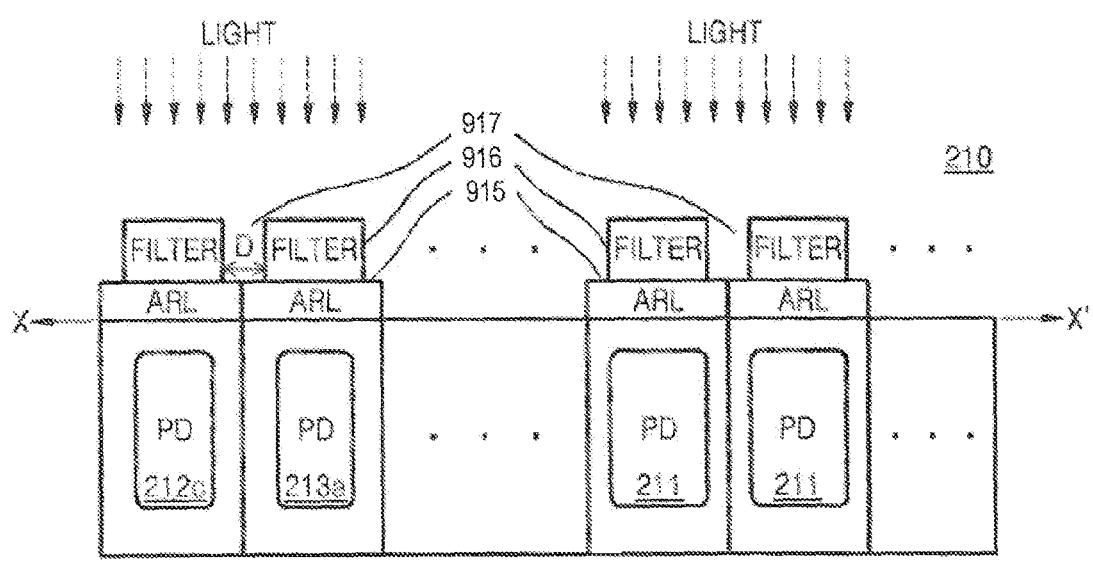
FIG. 9 illustrates a portion of a cross-sectional view taken along a line X-X' of FIG. 3.

FIG. 9 illustrates a portion of a cross-sectional view taken along a line X-X' of FIG. 3. As illustrated in FIG. 9, the pixel array portion 210 may include a plurality of pixels and each of the pixels may include a photodiode acting as a photo detecting device.

According to some embodiments, the pixel array portion 210 may include first photo detecting devices 211, second photo detecting devices 212c, third photo detecting devices 213a, anti-reflective layers (ARLs) 915 and filters 916. A full well capacity of each second photo detecting device 212c disposed in an edge of the pixel array portion 210 may be less than that of each first photo detecting device 211 disposed in a central region of the pixel array portion 210. Furthermore, a full well capacity of each third photo detecting device 213a disposed between the first and second photo detecting devices 211 and 212c may be less than that of each first photo detecting device 211 and may be greater than that of each second photo detecting device 212c.

As illustrated in FIG. 9, the ARLs 915 may be stacked on respective ones of the first to third photo detecting devices 211, 212c and 213a, and the filters 916 may be stacked on respective ones of the ARLs 915. Each of the filters 916, may allow specific wavelengths of light to pass through it and may irradiate the specific light onto one of the photo detecting devices 211, 212c and 213a. For example, each of the filters 916 may include a color filter that allows only visible rays to penetrate or a ultraviolet (UV) filter that allows only UV rays to penetrate. In some embodiments, each of the filters 916 may be one of a cyan filter, a yellow filter and a magenta filter. The ARLs 915 may reduce or prevent the light passing through the filters 916 from being reflected on surfaces of the photo detecting devices 211, 212c and 213a. The ARLs 915 may be formed of an oxynitride layer, for example, a silicon oxynitride (SiON) layer having a thickness of about 400 angstroms to about 500 angstroms.

The filters 916 of the pixel array portion 210 may be separated from each other by air gap regions 917. A width D of each air gap region 917 may be within the range of about 100 nanometers to about 300 nanometers. A refractive index of the filters 916 may be greater than that of the air gap regions 917. For example, if the air gap regions 917 are formed of air having a refractive index of one, the filters 916 may be formed of a material having a refractive index which is greater than one. In such a case, the light introduced into the filters 916 may be reflected on interfaces between the filters and the air gap regions 917 due to a difference between the refractive index of the filters 916 and the refractive index of the air gap regions 917. Thus, the pixel array portion 210 may be fabricated without any micro lenses for focusing the light on the photo detecting devices 211, 212c and 213a.

Figure 10:
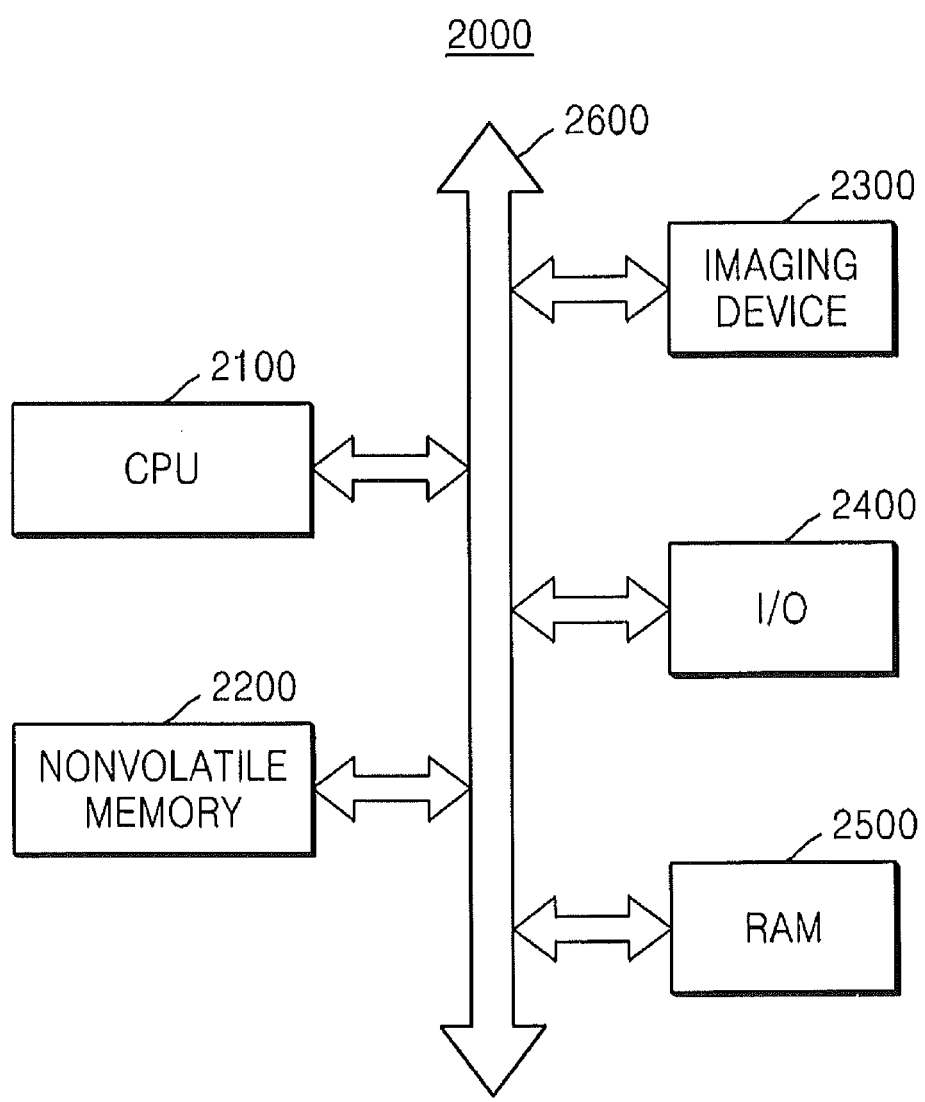
FIG. 10 is a block diagram of a system including an imaging device according to some embodiments of the inventive concept.

FIG. 10 is a block diagram of a system 2000 including an imaging device according to some exemplary embodiments of the inventive concept. The system 2000 may be a computer system, a camera system, a scanner, an automobile navigator, a video phone, a security system, or a movement detection system. Referring to FIG. 10, the system 2000 may include a central processing unit (CPU) 2100, a nonvolatile memory 2200, an imaging device 2300, an input/output (I/O) unit 2400 and a random access memory (RAM) 2500. The CPU 2100 may communicate with the nonvolatile memory 2200, the imaging device 2300, the I/O unit 2400 and the RAM 2500 through a bus 2600.

The imaging device 2300 may include the image sensor or the image signal processor described in the previous embodiments. For example, the image sensor in the imaging device 2300 may include a pixel array portion, and the pixel array portion may include first photo detecting devices having first full well capacities and second photo detecting devices having second full well capacities different from the first full well capacities. A full well capacity of any one of the second photo detecting devices disposed in edges of the pixel array portion may be less than that of any one of the first second photo detecting devices disposed in a central region of the pixel array portion. Furthermore, the pixel array portion may further include third photo detecting devices disposed between the first photo detecting devices and the second photo detecting devices. A full well capacity of each of the third photo detecting devices may be less than that of each of the first photo detecting devices and may be greater than that of each of the second photo detecting devices. The full well capacities of the first, second and third photo detecting devices may be determined according to a light intensity profile or a CRA of a module lens included in the imaging device 2300.

As described above, the imaging device 2300 may include the image signal processor. The image signal processor may receive source data generated from the image sensor to output image data in order to compensate for both the lens shading effect of the module lens and the non-uniform full well capacities of the photo detecting devices. The image data output from the image signal processor may be transmitted to the CPU 2100, the nonvolatile memory 220, the I/O unit 2400 and the RAM 2500 through the bus 2600. According to the exemplary embodiments, the imaging device 2300 may reduce leakage currents in the photo detecting devices to generate a clear image without white spots.

Figure 11:
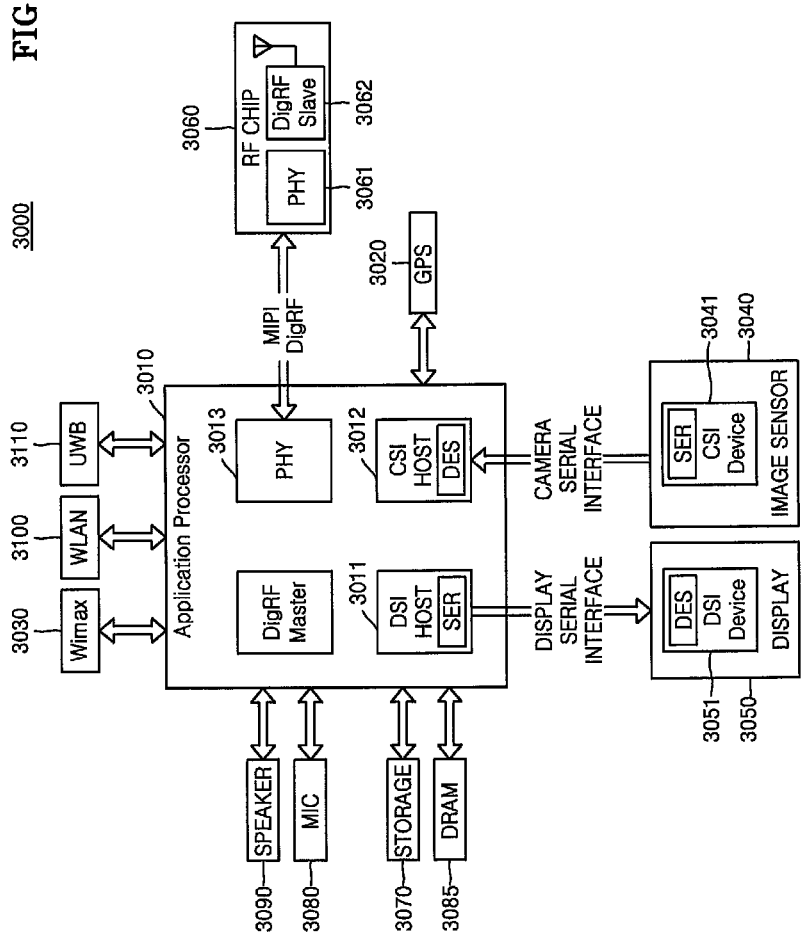
FIG. 11 is a block diagram of an electronic system including an image sensor according to some embodiments of the inventive concept.

FIG. 11 is a block diagram of an electronic system 3000 including an image sensor according to an exemplary embodiment of the inventive concept. Referring to FIG. 11, the electronic system 3000 may be a data processing system that can use or support a mobile industrial processor interface (MIPI). For example, the electronic system 3000 may be a mobile phone, a personal digital assistant (PDA), a portable multimedia player (PMP) or a smart phone. The electronic system 3000 may include an application processor 3010, an image processor 3040 and a display unit 3050. A camera serial interface (CSI) host 3012 in the application processor 3010 may communicate with a CSI device 3041 in the image processor 3040 through a CSI. In such a case, the CSI host 3012 may be configured to include an optical deserializer and the CSI device 3041 may be configured to include an optical serializer.

A display serial interface (DSI) host 3011 in the application processor 3010 may communicate with a DSI device 3051 in the display unit 3050 through a DSI. In such a case, the DSI host 3011 may be configured to include an optical serializer and the DSI device 3051 may be configured to include an optical deserializer.

The electronic system 3000 may further include a radio frequency (RF) chip 3060 that can communicate with the application processor 3010. A physical layer (PHY) device 3013 in the application processor 3010 may perform data communication with a PHY device 3061 in the RF chip 3060 according to a MIPI DigRF.

The electronic system 3000 may further include a global positioning system (GPS) 3020, a storage unit 3070, a microphone (MIC) 3080, a dynamic random access memory (DRAM) 3085 and a speaker 3090. The electronic system 3000 may communicate with external systems using world interoperability for microwave access (WIMAX) 3030, a wireless local area network (WLAN) 3100, an ultra wide band (UWB) 3110 or the like.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. An image sensor comprising:
   a pixel array including a central region and an edge;
   a first photo detecting device disposed in the central region of the pixel array; and
   a second photo detecting device disposed near an edge of the pixel array,
   wherein the second photo detecting device has a full well capacity that is less than a full well capacity of the first photo detecting device;
   wherein the image sensor further comprises:
   a third photo detecting device disposed in the pixel array portion between the first and second photo detecting devices, wherein the third photo detecting device has a full well capacity that is less than the full well capacity of the first photo detecting device and greater than the full well capacity of the second photo detecting device;
   a plurality of filters that pass specific wavelengths of light onto respective ones of the first, second and third photo detecting devices; and
   a plurality of air gap regions disposed between the plurality of filters,
   wherein respective refractive indices of each of the filters are greater than a refractive index of each of the air gap regions.

2. The image sensor of claim 1, wherein the full well capacities of the first, second and third photo detecting devices are proportional to the intensities of light refracted onto the first, second and third photo detecting devices through a module lens.

3. The image sensor of claim 2, wherein the full well capacities of the first, second and third photo detecting devices are related to a light intensity profile of the module lens.

4. The image sensor of claim 2,
   wherein the full well capacities of the first, second and third photo detecting devices are related to respective chief ray angles (CRAs) associated with the first, second and third photo detecting devices.

5. The image sensor of claim 1, wherein a planar surface area of the second photo detecting device is less than a planar surface area of the first photo detecting device.

6. The image sensor of claim 1,
   wherein each of the first and second photo detecting devices comprises a photodiode; and
   wherein a size of a photodiode of the second photo detecting device is less than a size of a photodiode of the first photo detecting device.

7. An imaging device comprising:
   a module lens that refracts light onto pixel array portion;
   an image sensor including a first photo detecting device disposed in a central region of the pixel array portion and a second photo detecting device disposed near an edge of the pixel array portion; and
   an image signal processor that receives source data output from the image sensor and that generates image data from the source data,
   wherein a full well capacity of the second photo detecting device is less than a full well capacity of the first photo detecting device, and wherein the image signal processor compensates for a difference between the full well capacity of the first photo detecting device and the full well capacity of the second photo detecting device;
   wherein the image signal processor comprises:
   a gain storing unit that stores a constant for compensating for a difference between the full well capacity of the first photo detecting device and the full well capacity of the second photo detecting device; and
   an operation unit that generates the image data in response to the source data and the constant.

8. The imaging device of claim 7, further comprising a third photo detecting device disposed in the pixel array portion between the first and second photo detecting devices,
   wherein the third photo detecting device has a full well capacity that is less than the full well capacity of the first photo detecting device and greater than the full well capacity of the second photo detecting device, and wherein the image signal processor compensates for a difference between the full well capacity of the first photo detecting device and the full well capacity of the third photo detecting device.

9. The imaging device of claim 8, wherein the image signal processor further compensates for a difference between the intensities of light incident on the first, second and third photo detecting devices through the module lens.

10. The imaging device of claim 8, wherein the image sensor further comprises:

a plurality of filters that irradiate specific wavelengths of light onto respective ones of the first, second and third photo detecting devices; and a plurality of air gap regions disposed between the plurality of filters, wherein refractive indices of each of the filters are greater than a refractive index of each of the air gap regions.

11. The imaging device of claim 7, wherein each of the first and second photo detecting devices comprises a photodiode;

wherein a size of a photodiode of the second photo detecting device is less than a size of a photodiode of the first photo detecting device; and wherein the image signal processor compensates for a difference between the sizes of the photodiodes of the first and second photo detecting devices.

12. The imaging device of claim 7, wherein the gain storing unit further stores a second constant for compensating for a difference between an intensity of light irradiated on the first photo detecting device and an intensity of light irradiated on the second photo detecting device.

\* \* \* \* \*